US010725130B2

(12) United States Patent
Li et al.

(10) Patent No.: US 10,725,130 B2
(45) Date of Patent: Jul. 28, 2020

(54) NUCLEAR MAGNETIC RESONANCE SENSING DEVICE FOR DOWNHOLE MEASUREMENTS

(71) Applicant: Halliburton Energy Services, Inc., Houston, TX (US)

(72) Inventors: Lilong Li, Humble, TX (US); Songhua Chen, Katy, TX (US); Arcady Reiderman, Richmond, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 0 days.

(21) Appl. No.: 15/776,571

(22) PCT Filed: Sep. 28, 2016

(86) PCT No.: PCT/US2016/054097
§ 371 (c)(1),
(2) Date: May 16, 2018

(87) PCT Pub. No.: WO2018/063176
PCT Pub. Date: Apr. 5, 2018

(65) Prior Publication Data
US 2018/0348319 A1 Dec. 6, 2018

(51) Int. Cl.
*G01R 31/00* (2006.01)
*G01R 33/38* (2006.01)
(Continued)

(52) U.S. Cl.
CPC ..... *G01R 33/3808* (2013.01); *G01R 33/3415* (2013.01); *G01V 3/32* (2013.01); *G01R 33/341* (2013.01); *G01R 33/383* (2013.01)

(58) Field of Classification Search
USPC ........................................ 324/303, 339, 366
See application file for complete search history.

(56) References Cited

U.S. PATENT DOCUMENTS

| 4,710,713 A | 12/1987 | Strikman |
| 4,714,881 A | 12/1987 | Givens |

(Continued)

FOREIGN PATENT DOCUMENTS

| GB | 2325981 B | 4/2002 |
| WO | 2016144460 A1 | 9/2016 |

OTHER PUBLICATIONS

International Search Report and the Written Opinion for International Application No. PCT/US2016/054097 dated May 31, 2017, 13 pages.

*Primary Examiner* — Vincent Q Nguyen
(74) *Attorney, Agent, or Firm* — Chamberlain Hrdlicka

(57) ABSTRACT

Nuclear magnetic resonance (NMR) method, system, and sensing device for downhole measurements. The NMR device for characterizing a subterranean zone includes a tool body, a magnetic element, and a radio frequency coil. The tool body includes an uphole end and a downhole end, where a longitudinal axis extends through the uphole end and downhole end. The magnetic element is located within the tool body and generates a static magnetic field (B0) in a longitudinal direction at a region of the subterranean zone. The radio frequency coil is located within the tool body and generates a radio frequency magnetic field (B1). The magnetic element and the radio frequency coil enable a side-looking NMR mode.

20 Claims, 5 Drawing Sheets

(51) Int. Cl.
    *G01V 3/32*         (2006.01)
    *G01R 33/3415*   (2006.01)
    *G01R 33/383*    (2006.01)
    *G01R 33/341*    (2006.01)

(56) References Cited

U.S. PATENT DOCUMENTS

| | | |
|---|---|---|
| 5,055,787 A | 10/1991 | Kleinberg et al. |
| 5,486,761 A | 1/1996 | Sezginer |
| 5,798,029 A * | 8/1998 | Morita ............... H01J 37/3402 204/298.07 |
| 6,348,792 B1 | 2/2002 | Beard et al. |
| 6,411,087 B1 | 6/2002 | Fan et al. |
| 8,421,454 B2 | 4/2013 | Prammer et al. |
| 2002/0033699 A1* | 3/2002 | Toufaily ............... G01N 24/081 324/318 |
| 2009/0072825 A1 | 3/2009 | Prammer et al. |
| 2013/0018602 A1 | 1/2013 | Ong et al. |
| 2014/0002071 A1 | 1/2014 | Martin |
| 2015/0061664 A1 | 3/2015 | Reiderman et al. |
| 2016/0033670 A1* | 2/2016 | Reiderman ............ G01V 3/32 324/303 |
| 2017/0082773 A1* | 3/2017 | Xiao ..................... G01V 3/32 |

\* cited by examiner

NUCLEAR MAGNETIC RESONANCE SENSING DEVICE FOR DOWNHOLE MEASUREMENTS This section is intended to provide relevant contextual information to facilitate a better understanding of the various aspects of the described embodiments. Accordingly, it should be understood that these statements are to be read in this light and not as admissions of prior art.

Various types of formation and fluid evaluations are performed on oil and gas wells before and during production operations. One type of formation evaluation is nuclear magnetic resonance (NMR) logging. NMR logging, a sub-category of electromagnetic logging, utilizes magnetic material to generate a static magnetic field and a coil to produce a radio frequency signal, and measures the induced magnet moment of hydrogen nuclei (protons) contained within the fluid-filled pore space of a formation.

NMR can be used to measure the volume, composition, viscosity, and distribution of these fluids, for example. NMR logging is typically performed by specialized NMR logging tools. In some applications, it is desirable to perform NMR logging while the NMR tool is moving with respect to the borehole without distorting the NMR measurement.

BRIEF DESCRIPTION OF THE DRAWINGS

For a detailed description of the embodiments of the invention, reference will now be made to the accompanying drawings in which.

DETAILED DESCRIPTION

The present disclosure provides an NMR logging tool capable of operating in a side-looking mode and producing a status magnetic field in a substantially longitudinal direction in an area of interest in a subterranean formation, thereby permitting NMR measurements to be made while the NMR tool is moving in or out of a well.

Figure 1A:
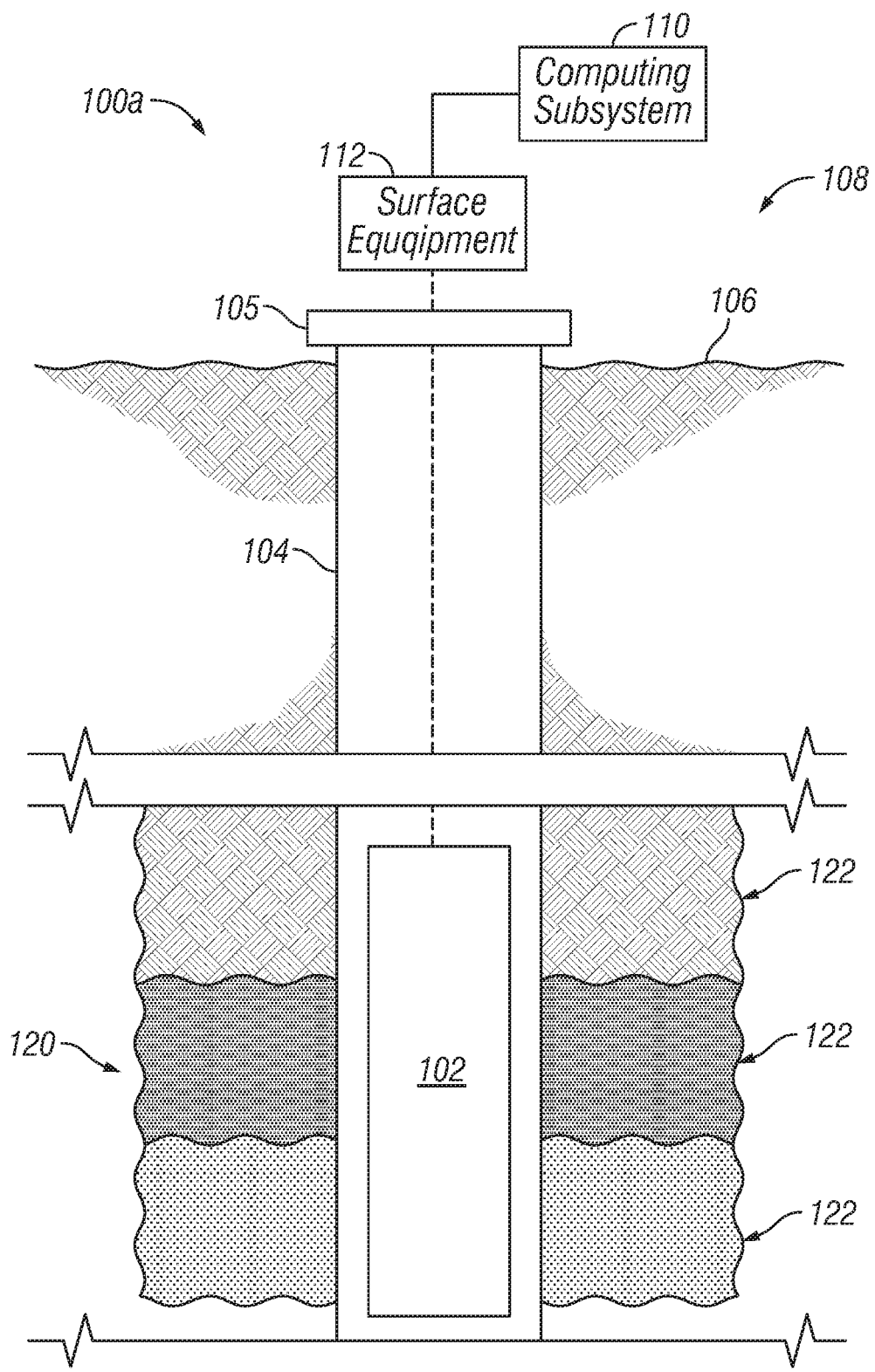
FIG. 1A depicts an example nuclear magnetic resonance (NMR) logging operation in a well system, in accordance with example embodiments.

Referring to the drawings, FIG. 1A is a diagram of an example well system 100a. The example well system 100a includes an NMR logging system 108 and a subterranean region 120 beneath the ground surface 106. A well system can include additional or different features that are not shown in FIG. 1A. For example, the well system 100a may include additional drilling system components, wireline logging system components, etc.

The subterranean region 120 can include all or part of one or more subterranean formations or zones. The example subterranean region 120 shown in FIG. 1A includes multiple subsurface layers 122 and a wellbore 104 penetrated through the subsurface layers 122. The subsurface layers 122 can include sedimentary layers, rock layers, sand layers, or combinations of these and other types of subsurface layers. One or more of the subsurface layers can contain fluids, such as brine, oil, gas, etc. Although the example wellbore 104 shown in FIG. 1A is a vertical wellbore, the NMR logging system 108 can be implemented in other wellbore orientations. For example, the NMR logging system 108 may be adapted for horizontal wellbores, slant wellbores, curved wellbores, vertical wellbores, or combinations of these.

The example NMR logging system 108 includes a logging tool 102, surface equipment 112, and a computing subsystem 110. In the example shown in FIG. 1A, the logging tool 102 is a downhole logging tool that operates while disposed in the wellbore 104. The example surface equipment 112 shown in FIG. 1A operates at or above the surface 106, for example, near the well head 105, to control the logging tool 102 and possibly other downhole equipment or other components of the well system 100. The example computing subsystem 110 can receive and analyze logging data from the logging tool 102. An NMR logging system can include additional or different features, and the features of an NMR logging system can be arranged and operated as represented in FIG. 1A or in another manner.

In some instances, all or part of the computing subsystem 110 can be implemented as a component of, or can be integrated with one or more components of, the surface equipment 112, the logging tool 102, or both. In some cases, the computing subsystem 110 can be implemented as one or more computing structures separate from but communicative with the surface equipment 112 and the logging tool 102.

In some implementations, the computing subsystem 110 is embedded in the logging tool 102, and the computing subsystem 110 and the logging tool 102 can operate concurrently while disposed in the wellbore 104. For example, although the computing subsystem 110 is shown above the surface 106 in the example shown in FIG. 1A, all or part of the computing subsystem 110 may reside below the surface 106, for example, at or near the location of the logging tool 102.

The well system 100a can include communication or telemetry equipment that allow communication among the computing subsystem 110, the logging tool 102, and other components of the NMR logging system 108. For example, the components of the NMR logging system 108 can each include one or more transceivers or similar apparatus for wired or wireless data communication among the various components. For example, the NMR logging system 108 can include systems and apparatus for wireline telemetry, wired pipe telemetry, mud pulse telemetry, acoustic telemetry, electromagnetic telemetry, or a combination of these and other types of telemetry. In some embodiments, the logging tool 102 receives commands, status signals, or other types of information from the computing subsystem 110 or another source. In some cases, the computing subsystem 110 receives logging data, status signals, or other types of information from the logging tool 102 or another source.

NMR logging operations can be performed in connection with various types of downhole operations at various stages in the lifetime of a well system. Structural attributes and components of the surface equipment 112 and logging tool 102 can be adapted for various types of NMR logging operations. For example, NMR logging may be performed during drilling operations, during wireline logging operations, or in other contexts. As such, the surface equipment 112 and the logging tool 102 may include, or may operate in connection with drilling equipment, wireline logging equipment, or other equipment for other types of operations.

Figure 1B:
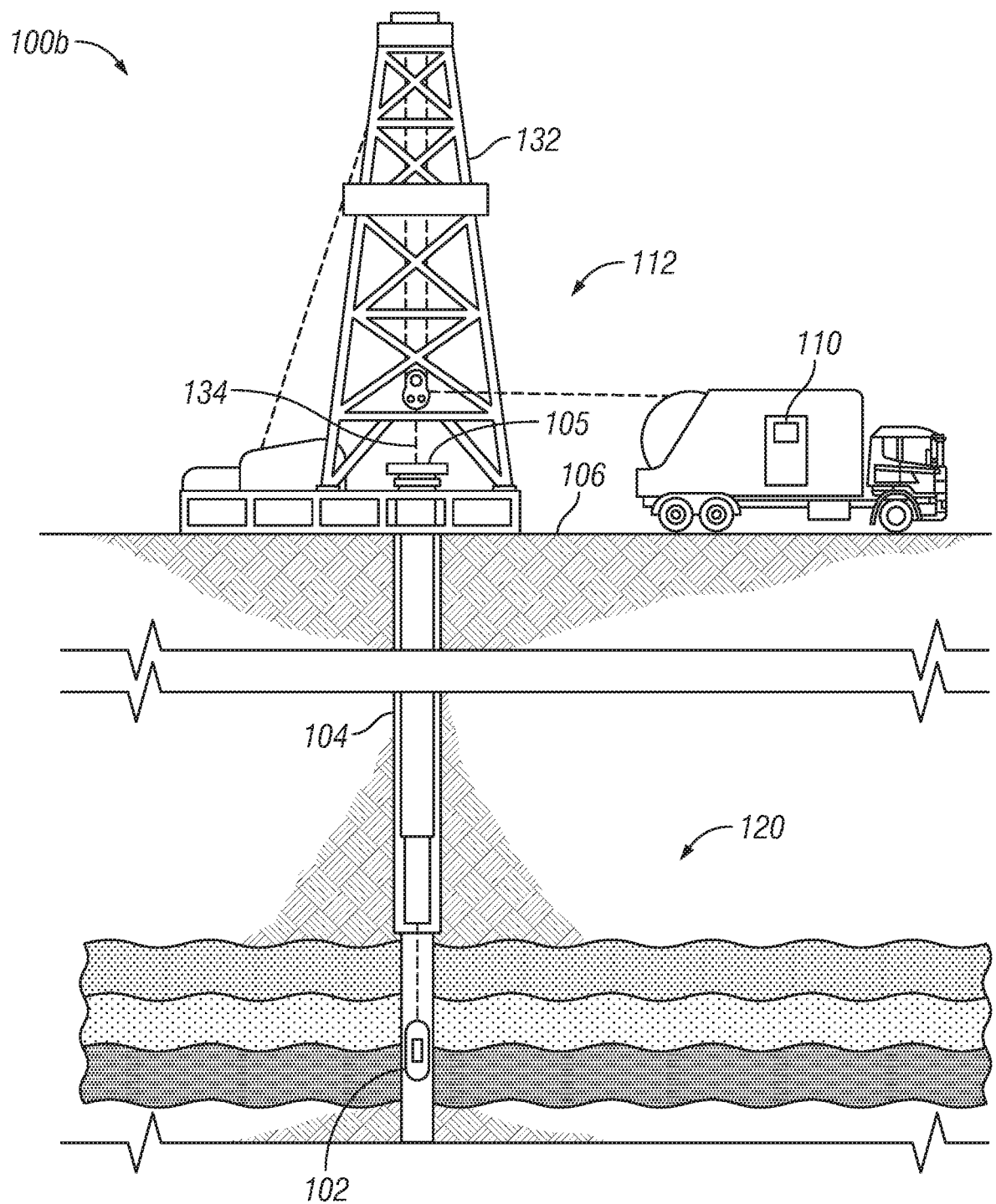
FIG. 1B depicts a wireline NMR logging system deployed in a well system, in accordance with example embodiments.

In some examples, NMR logging operations are performed during wireline logging operations. FIG. 1B shows an example well system 100b that includes the NMR logging tool 102 in a wireline logging environment. In some example wireline logging operations, the surface equipment 112 includes a platform above the surface 106 equipped with a derrick 132 that supports a wireline cable 134 that extends into the wellbore 104. Wireline logging operations can be performed, for example, after a drill string is removed from the wellbore 104, to allow the wireline logging tool 102 to be lowered by wireline or logging cable into the wellbore 104.

Figure 1C:
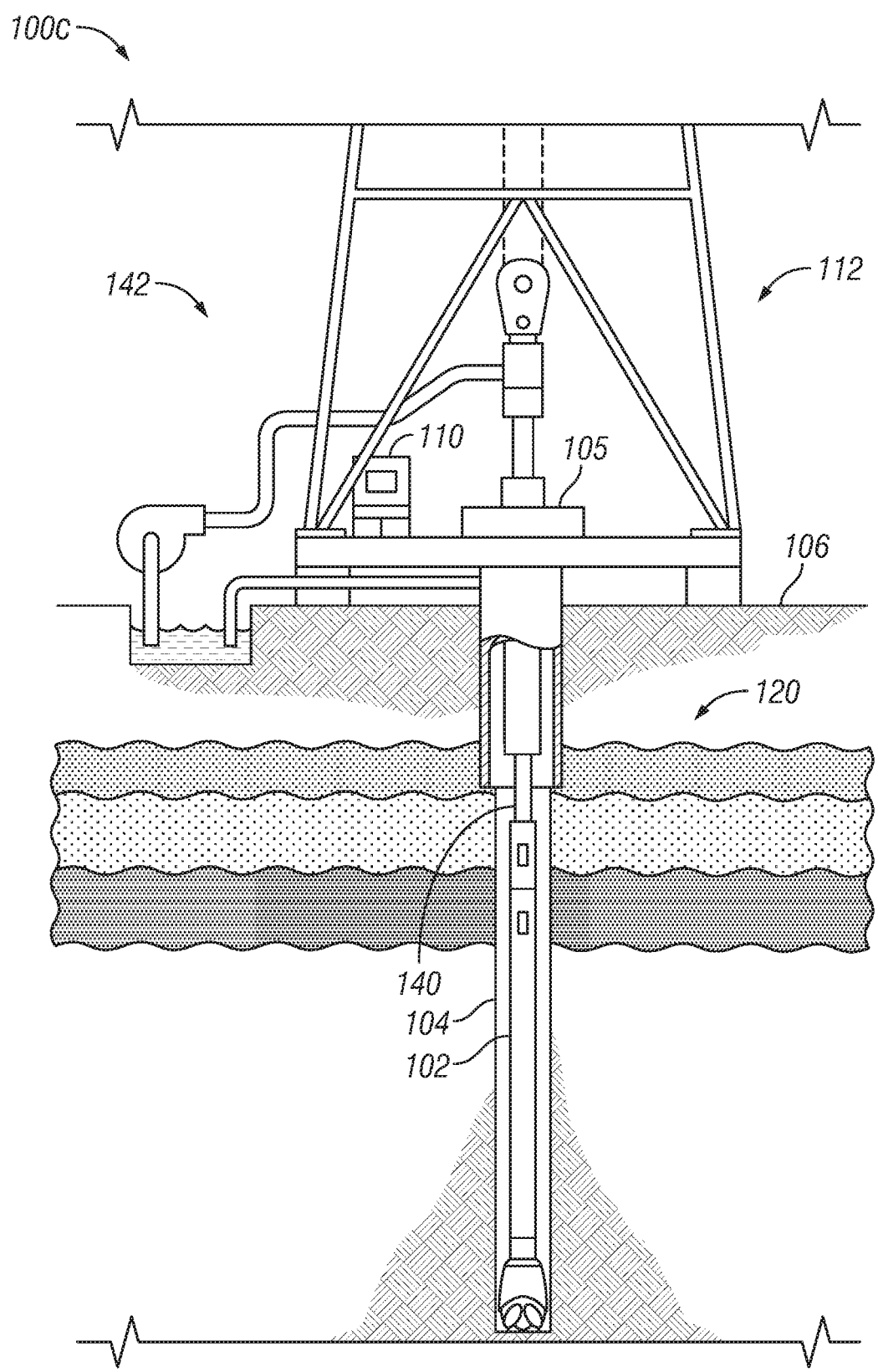
FIG. 1C depicts an NMR logging tool in a logging while drilling (LWD) environment, in accordance with example embodiments.

In some examples, NMR logging operations are performed during drilling operations. FIG. 1C shows an example well system 100c that includes the NMR logging tool 102 in a logging while drilling (LWD) environment. Drilling is commonly carried out using a string of drill pipes connected together to form a drill string 140 that is lowered through a rotary table into the wellbore 104. In some cases, a drilling rig 142 at the surface 106 supports the drill string 140, as the drill string 140 is operated to drill a wellbore penetrating the subterranean region 120. The drill string 140 may include, for example, a kelly, drill pipe, a bottom hole assembly, and other components. The bottom hole assembly on the drill string may include drill collars, drill bits, the logging tool 102, and other components. The logging tools may include measuring while drilling (MWD) tools, LWD tools, and others.

The logging tool 102 includes an NMR tool for obtaining NMR measurements from the subterranean region 120. As shown, for example, in FIG. 1B, the logging tool 102 can be suspended in the wellbore 104 by a coiled tubing, wireline cable, or another structure that connects the tool to a surface control unit or other components of the surface equipment 112.

The logging tool 102 is lowered to the bottom of a region of interest and subsequently pulled upward (e.g., at a substantially constant speed) through the region of interest. As shown, for example, in FIG. 1C, the logging tool 102 can be deployed in the wellbore 104 on jointed drill pipe, hard wired drill pipe, or other deployment hardware. In some example implementations, the logging tool 102 collects data during drilling operations as it moves downward through the region of interest. In some example implementations, the logging tool 102 collects data while the drill string 140 is moving, for example, while it is being tripped in or tripped out of the wellbore 104.

In some implementations, the logging tool 102 collects data at discrete logging points in the wellbore 104. For example, the logging tool 102 can move upward or downward incrementally to each logging point at a series of depths in the wellbore 104. At each logging point, instruments in the logging tool 102 perform measurements on the subterranean region 120. The logging 102 can also obtain measurements while the tool 102 is moving (e.g., being raised or lowered). The measurement data can be communicated to the computing subsystem 110 for storage, processing, and analysis. Such data may be gathered and analyzed during drilling operations (e.g., during logging while drilling (LWD) operations), during wireline logging operations, or during other types of activities. The data may also be gathered and then analyzed separately, even at a later time or date.

The computing subsystem 110 can receive and analyze the measurement data from the logging tool 102 to detect properties of various subsurface layers 122. For example, the computing subsystem 110 can identify the density, material content, or other properties of the subsurface layers 122 based on the NMR measurements acquired by the logging tool 102 in the wellbore 104. Specifically, well characterization data can be obtained by processing and interpreting the NMR measurements.

The logging tool 102 obtains NMR signals by polarizing nuclear spins in the formation 120 and pulsing the nuclei with a radio frequency (RF) magnetic field. Various pulse sequences (i.e., series of radio frequency pulses, delays, and other operations) can be used to obtain NMR signals, including the Carr Purcell Meiboom Gill (CPMG) sequence (in which the spins are first tipped using a tipping pulse followed by a series of refocusing pulses), the Optimized Refocusing Pulse Sequence (ORPS) in which the refocusing pulses are less than 180°, a saturation recovery pulse sequence, and other pulse sequences.

Figure 2:
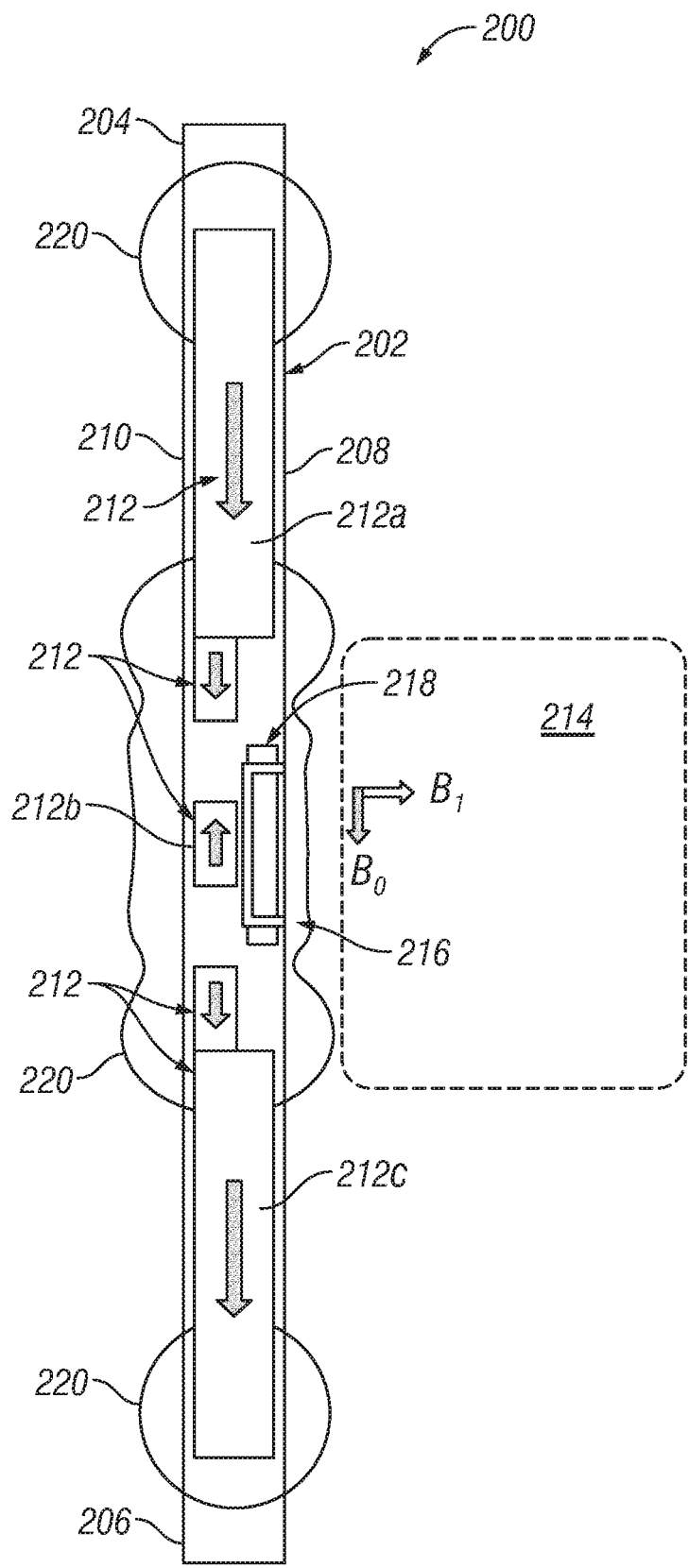
FIG. 2 depicts a diagram of an example NMR logging tool, in accordance with example embodiments.

FIG. 2 depicts a diagrammatical view of an NMR logging tool 200, in accordance with one or more embodiments. The NMR logging tool 200 can be implemented as a part of a logging while drilling tool or wireline tool. The tool 200 includes a tool body 202, an uphole end 204, a downhole end 206, a front side 208, and a back side 210, in which the front and back sides 208, 210 extend between the first and second ends 204, 206. In one or more embodiments, the front side 208 refers to a side of the tool body 202 closest to a region of interest 214 in the formation.

The tool 200 further includes a configuration of one or more magnetic elements 212 located within the tool body 202. The configuration of magnetic elements 212 generates a static magnet field 220 ($B_0$) in a longitudinal direction towards the region of interest 214 with respect to the tool body 202.

The radio frequency coil 216 is configured to generate a radio frequency magnetic field ($B_1$) substantially orthogonal to the static magnet field 220 ($B_0$) in the region of interest 214. The radio frequency coil 216 may include a radial coil that produces a radio frequency magnetic field in a radial direction, a tangential coil that produces a radio frequency magnetic field in a tangential direction, or a combination of both. Specifically, in some embodiments, both radial and tangential coils are used to produce a circular polarized magnetic field and enable circular polarized reception, which enhances signal-to-noise ratio (SNR).

In one or more embodiments, the radio frequency coil 216 is positioned towards the front side 208 of the tool body 200. The configuration of one or more magnetic elements 212 and the radio frequency coil 216 enables a side-looking NMR mode, in which a static magnetic field is generated in a substantially longitudinal direction in the region of interest 214. Specifically, the region of interest 214 is located in a side of the borehole facing the front side 208 of the tool body 202. The radio frequency coil 216 may also receive a signal produced from nuclear spin induced in the formation by $B_0$, $B_1$, or both.

The tool 200 may further include a soft magnetic material 218 positioned behind the coil 216. Soft magnetic materials are easily magnetized and demagnetized. The soft magnetic material 218 may help shape the static magnetic field by making the field 220 more uniform in the area of interest 214. The soft magnet material 218 may also enhance the efficiency of the antenna and improve SNR.

In one or more embodiments, the configuration of one or more magnetic elements 212 comprises a top magnetic 212a, a middle magnet 212b, and a bottom magnet 212c arranged and magnetized longitudinally in the tool body 202. In certain such embodiments, the top and bottom magnets 212a, 212c are magnetized in the opposite direction as the middle magnet 212b in order to generate the desired static magnetic field. Magnetizing the magnets 212 longitudinally also decreases the attraction between the tool 200 and casing in the borehole, as opposed to magnets magnetized transversely.

In one or more embodiments, the configuration of magnetic elements 212 also includes a magnet, such as middle magnet 212b, located towards the back side 210 of the tool body 202 opposite the coil 216 and away from the region of interest 214 to minimize borehole signal and avoid shorting or saturation of any soft magnetic material 218 located behind the coil 216. Placing the magnet towards the back side 210 also reduces the gradient in the area of interest 214 which allows a large area to be excited.

The configuration of one or more magnetic elements 212, such as in a symmetric fashion, is designed to provide a magnetic field 220 which is uniform in front of the coil 216 and in the region of interest 214. The magnetic field 220 is also configured to induce proper prepolarization of the nuclear spins at different logging speeds to maintain proper porosity evaluation.

In one or more embodiments, the configuration of magnetic elements 212 includes soft magnetic material. Soft magnet material can be used to smooth out the static magnetic field 220 in the region of interest 214. The soft magnet material can also make the static magnetic field 220 more uniform, and therefore more robust during movement of the tool 200. Additionally, the soft magnet material may shield the radio frequency field from conductive parts of the tool 200 which is beneficial for SNR.

The magnetic elements 212, in conjunction with the coil 216, enable side-looking NMR measurements to be taken from a region of the borehole at a radial distance from the NMR tool. The longitudinal orientation of the magnet field 220, $B_0$, also enables NMR measurements to be taken while the NMR tool 200 is moving longitudinally, as the magnetic field 220 will be substantially uniform along the longitudinal direction. Specifically, the coil 216 can receive an NMR response signal from the formation while the tool 200 moving or stationary. Alternatively, another radio frequency coil (not shown) can be used for receiving the NMR response signal. The NMR response signal is then communicated to the control system in the surface equipment 112.

Figure 3:
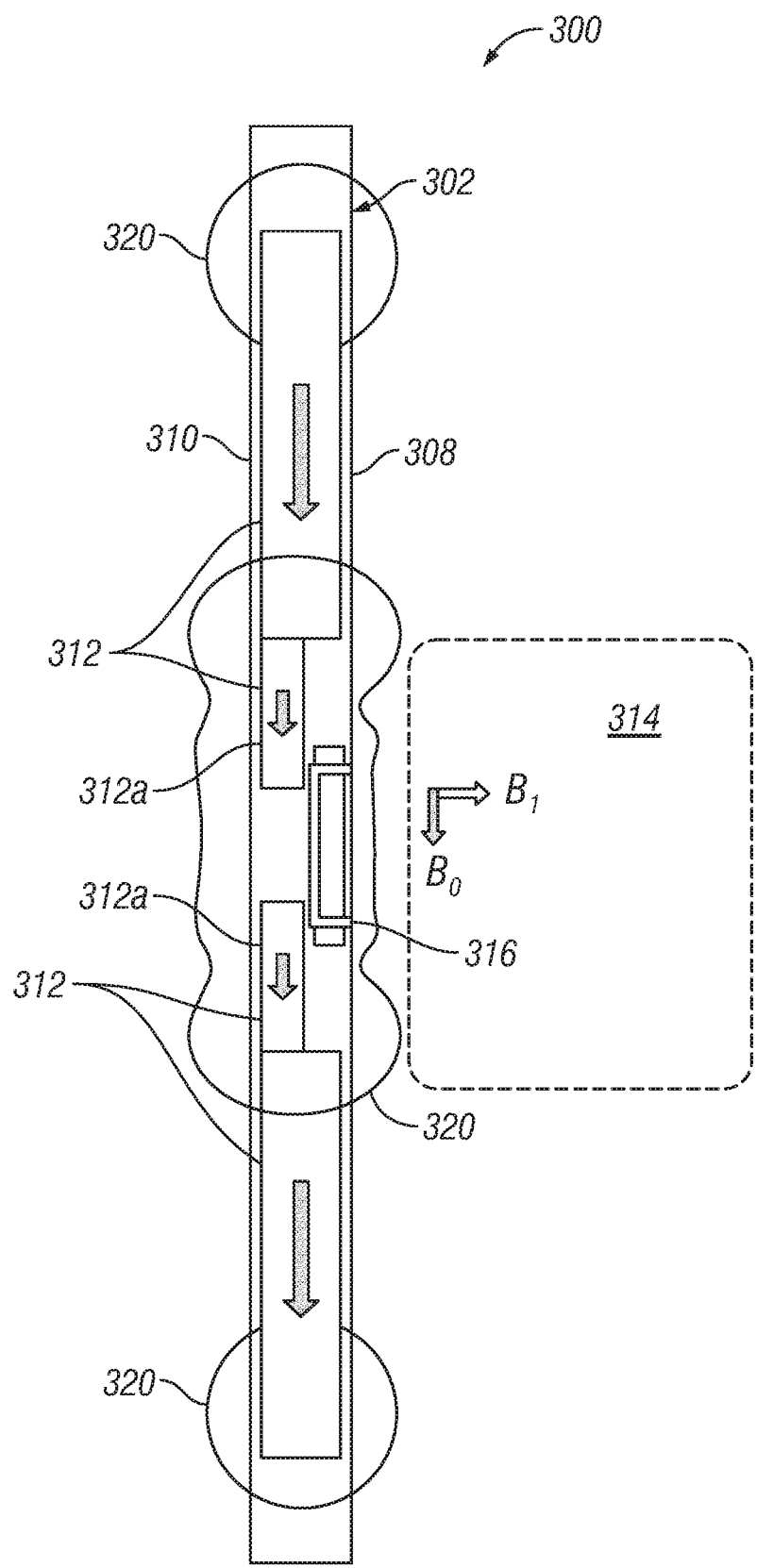
FIG. 3 depicts a diagram of another example NMR logging tool, in accordance with example embodiments.

FIG. 3 depicts another example NMR logging tool 300, in accordance with one or more embodiments. Similar to the tool 200 of FIG. 2, the tool 300 of FIG. 3 includes a tool body 302, and a configuration of magnetic elements 312 located within the tool body 302 that produces a static magnetic field 320 ($B_0$). Specifically, the static magnetic field 320 is substantially longitudinal with respect to the tool 300. The tool 300 also includes a radio frequency coil 316 located within the tool body 302 and towards a front side 308 of the tool body 302. The radio frequency coil 316 is configured generate a radio frequency magnetic field ($B_1$) substantially orthogonal to the static magnet field 320 ($B_0$). The radio frequency coil 316 may include a radial coil that produces a radio frequency magnetic field in a radial direction, a tangential coil that produces a radio frequency magnetic field in a tangential direction, or a combination of both. The radio frequency coil 316 may also receive a signal produced from nuclear spin induced in the formation by $B_0$, $B_1$, or both. The configuration of magnets 312 includes two magnets 312a located off-center with respect to the tool body 302 and towards a back side 310 of the tool body 202 away from the coil 316. The magnets 312 may be magnetized in the same direction.

The configuration of magnetic elements illustrated in FIGS. 2 and 3 are examples of many possible configurations suitable for producing a longitudinal magnetic field 220, $B_0$.

In certain other embodiments, the configuration of magnetic elements 212 may include soft magnetic material, among others.

The specific design of the configuration of the magnet elements may depend on the needs of the application, space available, and various other design criteria. However, the magnetic elements 212, in conjunction with the coil 216, are configured to enable side-looking NMR measurements to be taken from a region of the borehole at a radial distance from the NMR tool 200. The longitudinal orientation of the magnet field 220, $B_0$, also allows NMR measurements to be taken while the NMR tool 200 is moving longitudinally, as the magnetic field 220 will be substantially uniform along the longitudinal direction.

In addition to the embodiments described above, many examples of specific combinations are within the scope of the disclosure, some of which are detailed below:

Example 1

A nuclear magnetic resonance (NMR) device for characterizing a subterranean zone, comprising:
a tool body comprising an uphole end and a downhole end, a longitudinal axis extending through the uphole end and downhole end;
a magnetic element located within the tool body configured to generate a static magnetic field ($B_0$) in a longitudinal direction at a region of the subterranean zone;
a radio frequency coil located within the tool body and configured to generate a radio frequency magnetic field ($B_1$); and
wherein the magnetic element and the radio frequency coil are configured to enable a side-looking NMR mode.

Example 2

The device of example 1, wherein the magnetic element comprises one or more magnets.

Example 3

The device of example 1, wherein $B_0$ is substantially orthogonal to $B_1$ in a region of interest.

Example 4

The device of example 1, wherein the magnetic element comprises a magnet located towards one side of the tool body, and wherein the radio frequency coil is located towards an opposite side of the tool body.

Example 5

The device of example 1, wherein the magnetic element comprises a top magnet, a middle magnet, and a bottom magnet arranged and magnetized longitudinally in the tool body, wherein the top and bottom magnets are magnetized in the opposite direction as the middle magnet.

Example 6

The device of example 1, wherein the co magnetic element comprises a soft magnetic material.

Example 7

The device of example 1, wherein the radio frequency coil comprises a radial coil, a tangential coil, or combination of both.

Example 8

The device of example 1, wherein the radio frequency coil is configured to receive a signal produced by nuclear spin induced by $B_0$, $B_1$, or both.

Example 9

The device of example 1, wherein the magnetic element is symmetric.

Example 10

A nuclear magnetic resonance (NMR) subterranean characterization system, comprising:
  a NMR device configured to operate in a side-looking NMR mode and produce a static magnetic field in an area of interest in a longitudinal direction, wherein the NMR device comprises:
    a tool body;
    a magnetic assembly located within the tool body configured to generate the static magnetic field; and
    a radio frequency coil located within the tool body configured to generate a radio frequency magnetic field in the region of interest; and
  a control system configured to receive an NMR response signal from the area of interest while the NMR device is stationary or moving.

Example 11

The system of example 10, wherein the magnetic assembly comprises a magnet located towards a back side of the tool body, and wherein the radio frequency coil is located towards a front side of the tool body.

Example 12

The system of example 10, wherein the radio frequency coil comprises a radial coil, a tangential coil, or both.

Example 13

The system of example 10, wherein the magnetic assembly comprises a top magnetic, a middle magnet, and a bottom magnet arranged and magnetized longitudinally in the tool body, wherein the top and bottom magnets are magnetized in the opposite direction as the middle magnet.

Example 14

The system of example 10, wherein the magnetic assembly comprises a top magnetic assembly and a bottom magnetic assembly arranged symmetrically with respect to the radio frequency coil.

Example 15

The device of example 10, wherein the NMR device is coupled to wireline system or a logging while drilling system.

Example 16

The device of example 10, wherein the magnetic assembly is symmetric.

Example 17

A method of characterizing a subterranean formation with nuclear magnetic resonance (NMR), comprising:
  inducing a static magnetic field ($B_0$) via a magnetic assembly located within an NMR tool, wherein the static magnetic field ($B_0$) is longitudinal with respect to the NMR tool;
  generating a radio frequency magnetic field ($B_1$) via a first radio frequency coil located in the NMR tool; and
  performing side-looking NMR logging of the subterranean formation via the magnetic assembly and radio frequency coil.

Example 18

The method of example 17, further comprising driving the radio frequency coil at an adjustable frequency, pulse scheme, or both.

Example 19

The method of example 17, further comprising conveying the NMR device into a borehole through the subterranean formation.

Example 20

The method of example 17, further comprising receiving an NMR response signal via the first radio frequency coil or a second radio frequency coil while the NMR tool is stationary or moving.

Example 21

The method of example 20, further comprising processing the NMR response signal into well characterization data.

This discussion is directed to various embodiments of the invention. The drawing figures are not necessarily to scale. Certain features of the embodiments may be shown exaggerated in scale or in somewhat schematic form and some details of conventional elements may not be shown in the interest of clarity and conciseness. Although one or more of these embodiments may be preferred, the embodiments disclosed should not be interpreted, or otherwise used, as limiting the scope of the disclosure, including the claims. It is to be fully recognized that the different teachings of the embodiments discussed may be employed separately or in any suitable combination to produce desired results. In addition, one skilled in the art will understand that the description has broad application, and the discussion of any embodiment is meant only to be exemplary of that embodiment, and not intended to intimate that the scope of the disclosure, including the claims, is limited to that embodiment.

Certain terms are used throughout the description and claims to refer to particular features or components. As one skilled in the art will appreciate, different persons may refer to the same feature or component by different names. This document does not intend to distinguish between components or features that differ in name but not function, unless specifically stated. In the discussion and in the claims, the terms "including" and "comprising" are used in an open-ended fashion, and thus should be interpreted to mean "including, but not limited to . . . ." Also, the term "couple" or "couples" is intended to mean either an indirect or direct connection. In addition, the terms "axial" and "axially" generally mean along or parallel to a central axis (e.g., central axis of a body or a port), while the terms "radial" and "radially" generally mean perpendicular to the central axis. The use of "top," "bottom," "above," "below," and variations of these terms is made for convenience, but does not require any particular orientation of the components.

Reference throughout this specification to "one embodiment," "an embodiment," or similar language means that a particular feature, structure, or characteristic described in connection with the embodiment may be included in at least one embodiment of the present disclosure. Thus, appearances of the phrases "in one embodiment," "in an embodiment," and similar language throughout this specification may, but do not necessarily, all refer to the same embodiment.

Although the present invention has been described with respect to specific details, it is not intended that such details should be regarded as limitations on the scope of the invention, except to the extent that they are included in the accompanying claims.

What is claimed is:

1. A nuclear magnetic resonance (NMR) device for characterizing a subterranean zone, comprising:
    a tool body comprising an uphole end and a downhole end, a longitudinal axis extending through the uphole end and downhole end;
    a magnetic element configured to generate a static magnetic field ($B_0$) in a substantially longitudinal direction in a region of interest in the subterranean zone;
    a radio frequency coil configured to generate a radio frequency magnetic field ($B_1$) substantially orthogonal to $B_0$ in the region of interest; and
    wherein the magnetic element and the radio frequency coil are configured to enable a side-looking NMR mode.

2. The device of claim 1, wherein the magnetic element comprises one or more magnets.

3. The device of claim 1, wherein the magnetic element comprises a magnet located towards one side of the tool body, and wherein the radio frequency coil is located towards an opposite side of the tool body.

4. The device of claim 1, wherein the magnetic element comprises a top magnet, a middle magnet, and a bottom magnet arranged and magnetized longitudinally in the tool body, wherein the top and bottom magnets are magnetized in the opposite direction as the middle magnet.

5. The device of claim 1, wherein the magnetic element comprises a soft magnetic material.

6. The device of claim 1, wherein the radio frequency coil comprises a radial coil, a tangential coil, or combination of both.

7. The device of claim 1, wherein the radio frequency coil is configured to receive a signal produced by nuclear spin induced by $B_0$, $B_1$, or both.

8. The device of claim 1, wherein the magnetic element is symmetric.

9. A nuclear magnetic resonance (NMR) subterranean characterization system for characterizing a region of interest in a subterranean formation, comprising:
    a NMR device configured to operate in a side-looking NMR mode and produce a static magnetic field in a substantially longitudinal direction in the region of interest, wherein the NMR device comprises:
    a tool body;
    a magnetic assembly configured to generate the static magnetic field;
    and
    a radio frequency coil configured to generate a radio frequency magnetic field substantially orthogonal to the static magnetic field in the region of interest; and
    a control system configured to receive an NMR response signal from the area of interest while the NMR device is stationary or moving.

10. The system of claim 9, wherein the magnetic assembly comprises a magnet located towards a back side of the tool body, and wherein the radio frequency coil is located towards a front side of the tool body.

11. The system of claim 9, wherein the radio frequency coil comprises a radial coil, a tangential coil, or both.

12. The system of claim 9, wherein the magnetic assembly comprises a top magnet, a middle magnet, and a bottom magnet arranged and magnetized longitudinally in the tool body, wherein the top and bottom magnets are magnetized in the opposite direction as the middle magnet.

13. The system of claim 9, wherein the magnetic assembly comprises a top magnetic assembly and a bottom magnetic assembly arranged symmetrically with respect to the radio frequency coil.

14. The device of claim 9, wherein the NMR device is coupled to wireline system or a logging while drilling system.

15. The device of claim 9, wherein the magnetic assembly is symmetric.

16. A method of characterizing a subterranean formation with nuclear magnetic resonance (NMR), comprising:
    inducing a static magnetic field ($B_0$) via a magnetic assembly located within an NMR tool, wherein the static magnetic field ($B_0$) is substantially longitudinal with respect to the NMR tool in a region of interest in the subterranean formation;
    generating a radio frequency magnetic field ($B_1$) via a first radio frequency coil located in the NMR tool that is substantially orthogonal to $B_0$ in the region of interest; and
    performing side-looking NMR logging of the subterranean formation via the magnetic assembly and radio frequency coil.

17. The method of claim 16, further comprising driving the radio frequency coil at an adjustable frequency, pulse scheme, or both.

18. The method of claim 16, further comprising conveying the NMR device into a borehole through the subterranean formation.

19. The method of claim 16, further comprising receiving an NMR response signal via the first radio frequency coil or a second radio frequency coil while the NMR tool is stationary or moving.

20. The method of claim 19, further comprising processing the NMR response signal into well characterization data.

* * * * *